(12) United States Patent
Fukuzono et al.

(10) Patent No.: US 11,004,781 B2
(45) Date of Patent: May 11, 2021

(54) ELECTRONIC COMPONENT MOUNTING SUBSTRATE, ELECTRONIC DEVICE, AND ELECTRONIC MODULE

(71) Applicant: KYOCERA Corporation, Kyoto (JP)

(72) Inventors: Shigeyoshi Fukuzono, Kyoto (JP); Yuuki Baba, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/642,040

(22) PCT Filed: Aug. 24, 2018

(86) PCT No.: PCT/JP2018/031376
§ 371 (c)(1),
(2) Date: Feb. 26, 2020

(87) PCT Pub. No.: WO2019/044706
PCT Pub. Date: Mar. 7, 2019

(65) Prior Publication Data
US 2021/0066180 A1 Mar. 4, 2021

(30) Foreign Application Priority Data
Aug. 29, 2017 (JP) .............................. JP2017-164453

(51) Int. Cl.
*H05K 3/46* (2006.01)
*H01L 23/498* (2006.01)
*H01L 33/62* (2010.01)

(52) U.S. Cl.
CPC .. *H01L 23/49838* (2013.01); *H01L 23/49822* (2013.01); *H01L 33/62* (2013.01)

(58) Field of Classification Search
CPC ........ H05K 1/112; H05K 1/114; H05K 1/115; H05K 1/18; H05K 1/181; H05K 1/182; H05K 1/183; H05K 3/46
USPC .................................................. 174/255, 262
See application file for complete search history.

(56) References Cited

U.S. PATENT DOCUMENTS

| 2004/0256715 | A1 | 12/2004 | Seki | |
| 2005/0077083 | A1* | 4/2005 | Mattix | H05K 3/4602 174/265 |
| 2007/0236895 | A1* | 10/2007 | Bartley | H05K 1/167 361/737 |
| 2014/0305688 | A1* | 10/2014 | Matsumoto | H05K 1/115 174/262 |

FOREIGN PATENT DOCUMENTS

| JP | 2003-298240 A | 10/2003 |
| JP | 2005-011883 A | 1/2005 |
| JP | 2014-086679 A | 5/2014 |
| JP | 2015-159245 A | 9/2015 |

* cited by examiner

*Primary Examiner* — Sherman Ng
(74) *Attorney, Agent, or Firm* — Volpe Koenig (57) ABSTRACT

An electronic component mounting substrate including: an insulating substrate for mounting an electronic component; a via conductor disposed in the insulating substrate in an thickness direction of the insulating substrate; and a via pad conductor disposed in the insulating substrate, connected to the via conductor, having a thickness gradually increasing from an outer edge portion toward an inside portion, and including a protruding portion protruding from the via conductor in a width direction of the via conductor.

14 Claims, 12 Drawing Sheets

ELECTRONIC COMPONENT MOUNTING SUBSTRATE, ELECTRONIC DEVICE, AND ELECTRONIC MODULE

TECHNICAL FIELD

The present invention relates to an electronic component mounting substrate, an electronic device, and an electronic module.

BACKGROUND ART

In the related art, an electronic component mounting substrate and an electronic device are known, for mounting electronic components on a main surface of an insulating substrate made of ceramics.

In such an electronic component mounting substrate, the insulating substrate has a recess portion on an upper surface for housing and mounting each of the electronic components, and includes a conductor layer on a bottom surface of the recess portion, a conductor layer on a lower surface to be connected to a module substrate, and a via conductor between the conductor layers (referred to, for example, Japanese Unexamined Patent Application Publication No. 2015-159245).

SUMMARY OF INVENTION

An electronic component mounting substrate of the present disclosure includes an insulating substrate for mounting an electronic component; a via conductor disposed in the insulating substrate in a thickness direction of the insulating substrate; and a via pad conductor disposed in the insulating substrate, connected to the via conductor, having a thickness gradually increasing from an outer edge portion toward an inside portion, and including a protruding portion protruding from the via conductor in a width direction of the via conductor.

An electronic device of the present disclosure includes the electronic component mounting substrate according to the configuration described above; and an electronic component mounted on the recess portion.

An electronic module of the present disclosure includes a module substrate including a connection pad; and the electronic device connected to the connection pad via solder.

DESCRIPTION OF EMBODIMENTS

Several exemplary embodiments of the present disclosure will be described with reference to the accompanying drawings.

First Embodiment

Figure 3A:
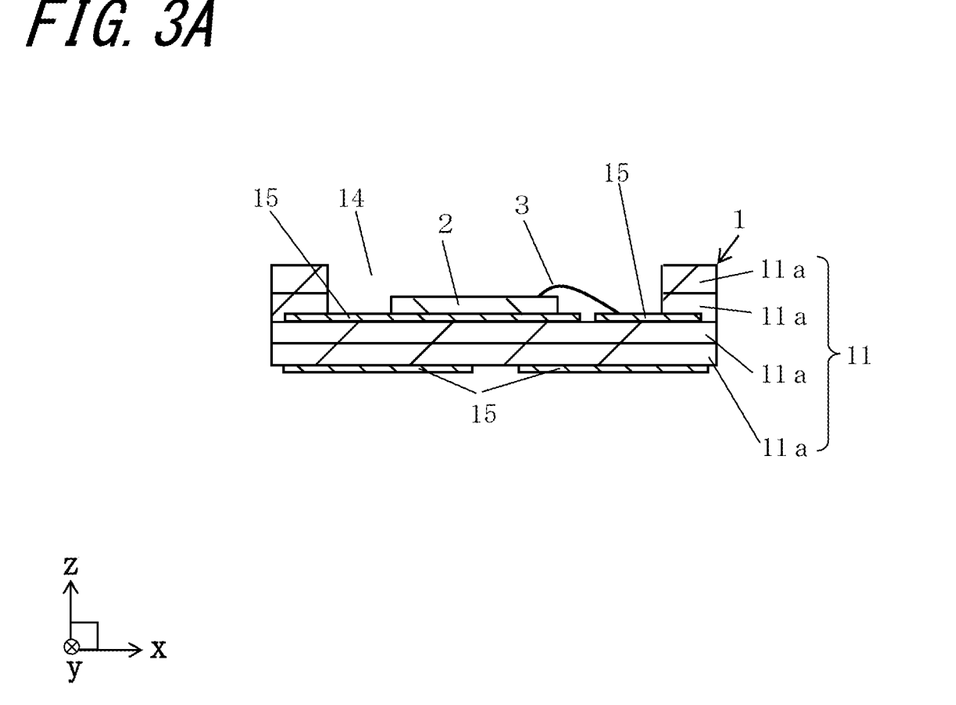
FIG. 3A is a longitudinal sectional view taken along line A-A of the electronic device illustrated in FIG. 1A
Figure 3B:
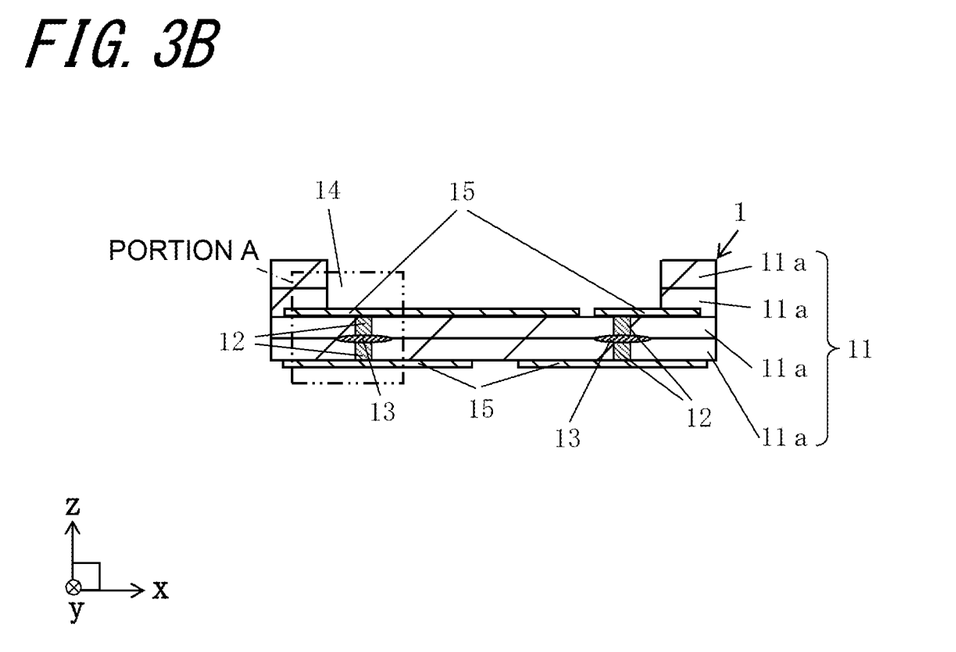
FIG. 3B is a longitudinal sectional view taken along line B-B.
Figure 4:
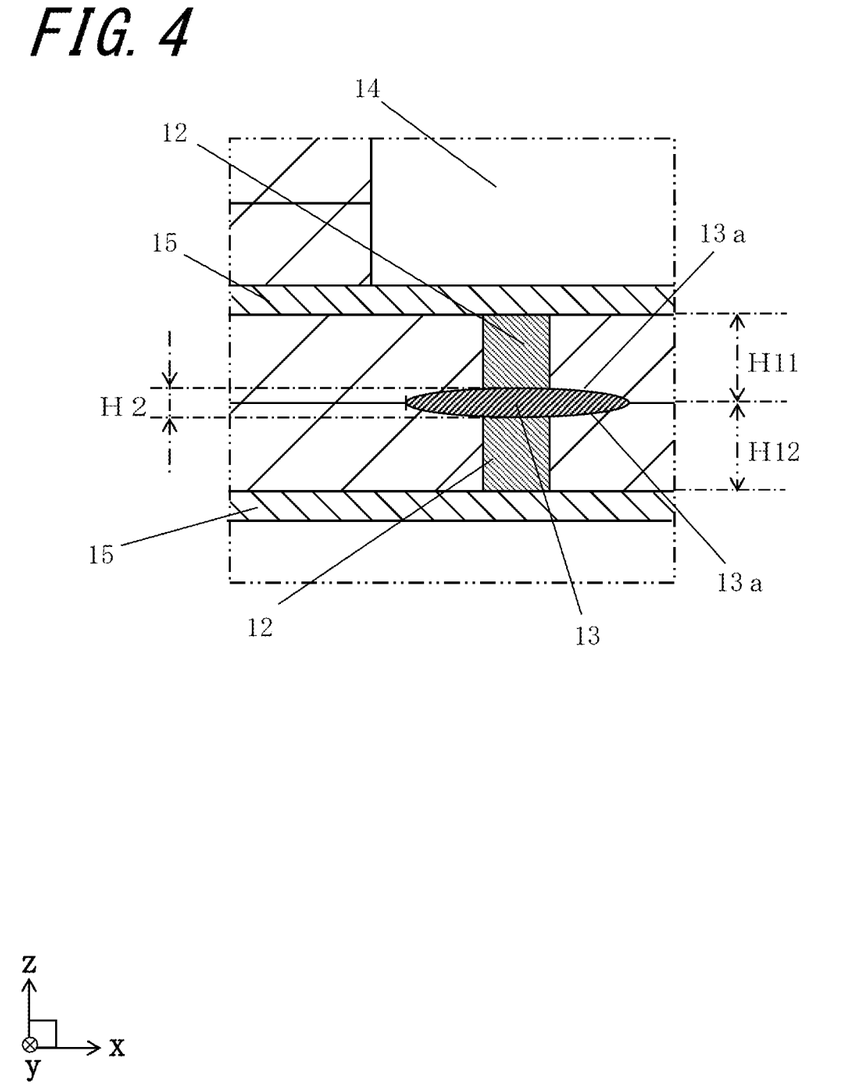
FIG. 4 is an enlarged sectional view of a main portion in portion A of the electronic device illustrated in FIG. 3B.
Figure 5:
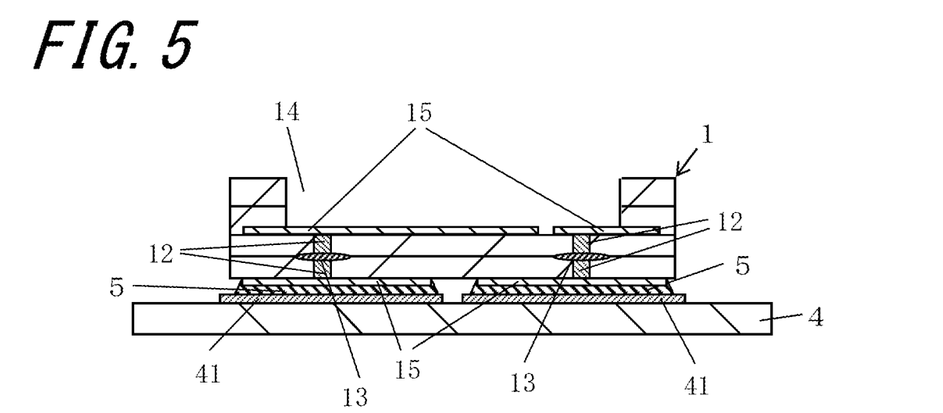
FIG. 5 is a longitudinal sectional view illustrating an electronic module using the electronic device in FIGS. 1A and 1B mounted on a module substrate.

As illustrated in FIGS. 1A to 5, an electronic device according to a first embodiment includes an electronic component mounting substrate 1 and an electronic component 2 mounted on a recess portion 14 of the electronic component mounting substrate 1. As illustrated in FIG. 5, the electronic device is connected to, for example, a module substrate 4 constituting an electronic module by using solder 5.

The electronic component mounting substrate 1 in the first embodiment includes an insulating substrate 11 for mounting the electronic component 2, a via conductor 12 positioned in the insulating substrate 11 in a thickness direction, and a via pad conductor 13 positioned in the insulating substrate 11, connected to the via conductor 12, having a thickness that gradually increases from an outer edge portion toward an inside portion, and including a protruding portion 13a that protrudes from the via conductor 12 in a width direction of the via conductor 12. The insulating substrate 11 has a recess portion 14 for mounting the electronic component 2 on one main surface, and conductor layers 15 are positioned on a surface and an inside of the recess portion 14. In FIGS. 1A to 4, an upward direction refers to a positive direction of a virtual z axis. A distinction between top and bottom in the following description is for convenience, and there is no intention to restrict the top and bottom if the electronic component mounting substrate 1 or the like is actually used.

Figure 1A:
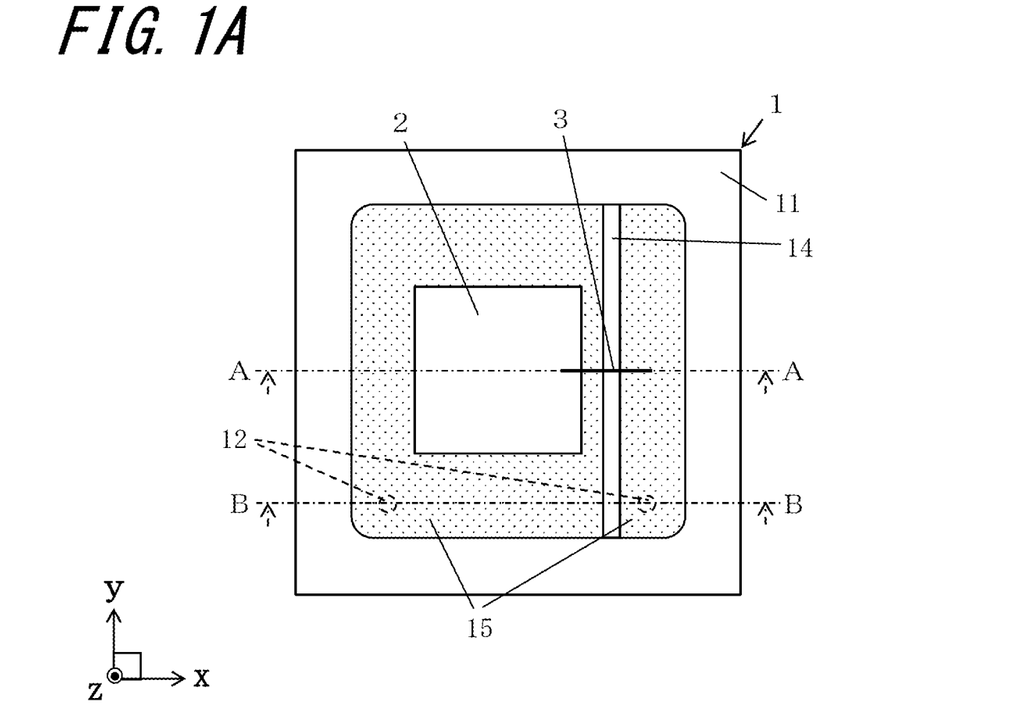
FIG. 1A is a top view illustrating an electronic device in a first embodiment and FIG. 1B is a bottom view of FIG. 1A.
Figure 1B:
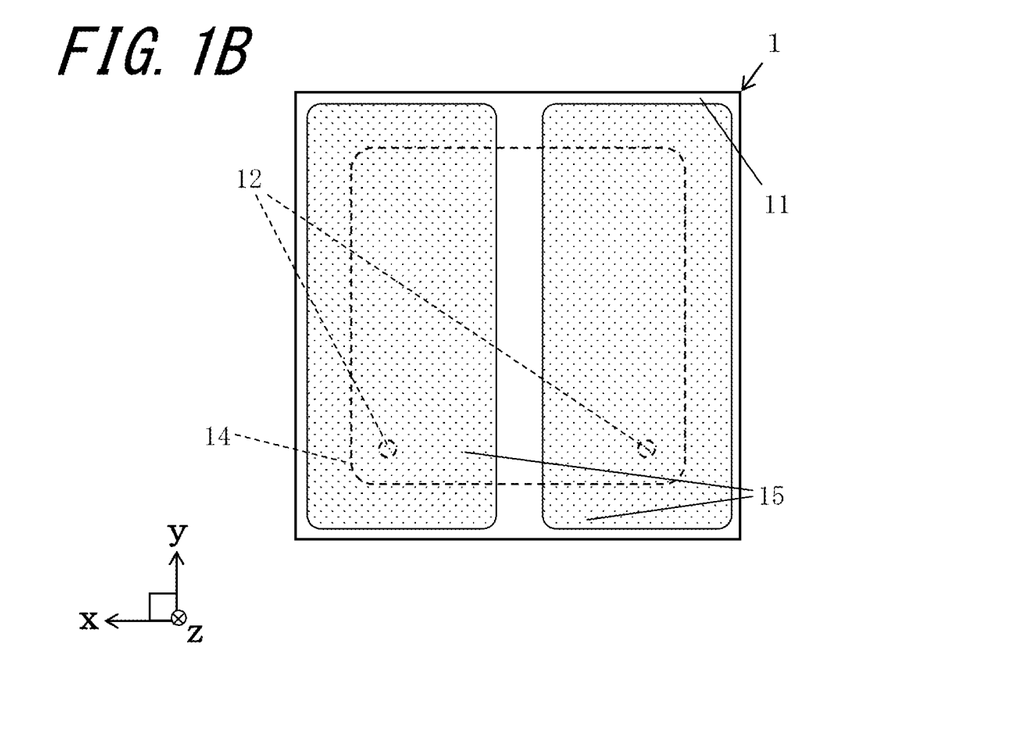

In the example illustrated in FIGS. 1A and 1B, the conductor layers 15 are indicated by shading, if viewed in a plan view, and a portion overlapping a side surface of the via conductor 12 is indicated by a dotted line. In the example illustrated in FIGS. 2A and 2B, the via pad conductor 13 and the conductor layer 15 are indicated by shading, if viewed in a plan view, and a portion overlapping the side surface of the via conductor 12 and a portion overlapping an inner wall of the recess portion 14 are indicated by dotted lines.

The insulating substrate 11 has one main surface (upper surface in FIGS. 1A to 4), the other main surface (lower surface in FIGS. 1A to 4) opposite to the main surface, and a side surface. The insulating substrate 11 is configured of a plurality of insulating layers 11a, is open to the main surface, and has the recess portion 14 for mounting the electronic component 2. The insulating substrate 11 has a shape of a rectangular plate, if viewed in a plan view, that is, viewed in a direction perpendicular to the main surface. The insulating substrate 11 functions as a support for supporting the electronic component 2, and the electronic component 2 is bonded and fixed to a mounting portion on a bottom surface of the recess portion 14, via a connection member 3 such as solder bump, gold bump, conductive resin (anisotropic conductive resin, gold bump, or the like), or resin.

For the insulating substrate 11, for example, ceramics such as an aluminum oxide sintered body (alumina ceramics), an aluminum nitride sintered body, a silicon nitride sintered body, a mullite sintered body, or a glass ceramic sintered body can be used. If the insulating substrate 11 is, for example, the aluminum oxide sintered body, an appropriate organic binder and a solvent are added and mixed to a raw material powder such as aluminum oxide ($Al_2O_3$), silicon oxide ($SiO_2$), magnesium oxide (MgO), or calcium oxide (CaO), and the like to product a slurry. A ceramic green sheet is produced by forming the slurry in a sheet form by using a well-known doctor blade method, a calendar roll method, or the like of the related art. Next, an appropriate punching process is performed on the ceramic green sheet, and a plurality of ceramic green sheets is laminated to form a green body, and the green body is fired at a high temperature (approximately 1,600° C.), whereby the insulating substrate 11 is produced.

Figure 2A:
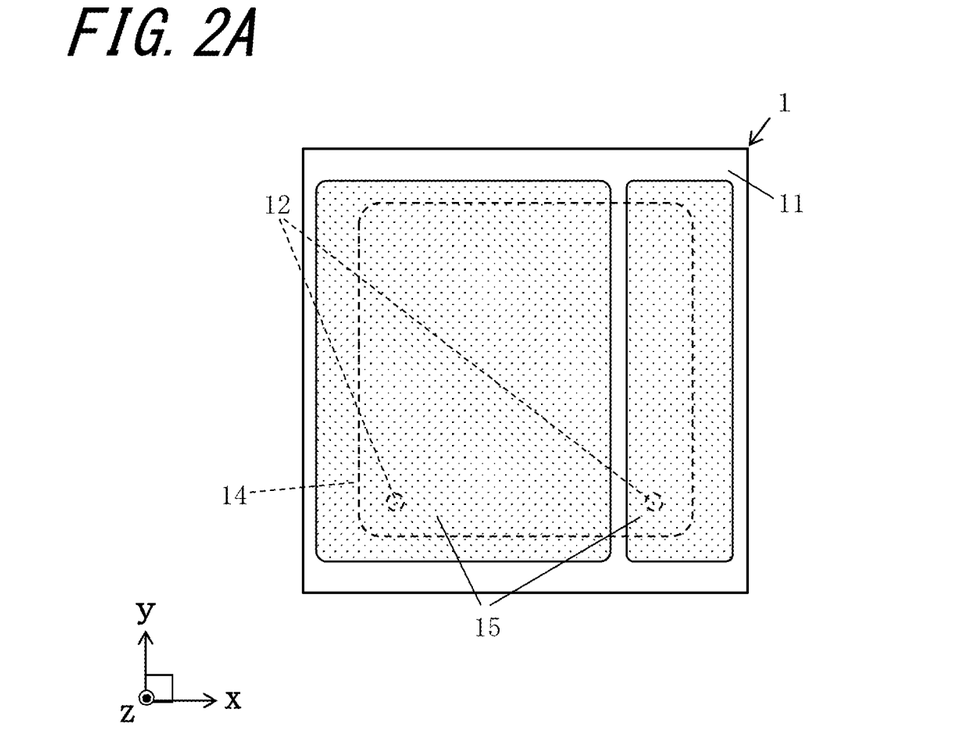
FIGS. 2A and 2B are top views of an inside of the electronic device illustrated in FIG. 1.
Figure 2B:
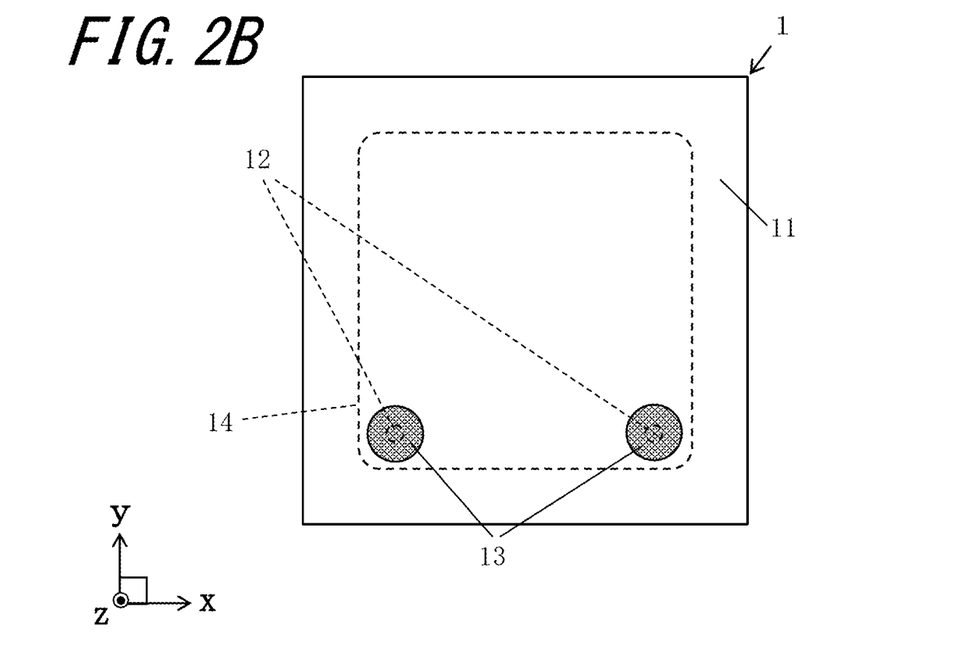

In the example illustrated in FIGS. 1A to 2B, the recess portion 14 is positioned on the main surface of the insulating substrate 11. The recess portion 14 is for mounting the electronic component 2 on the bottom surface. In the example illustrated in FIGS. 1A and 1B, the recess portion 14 has a rectangular shape with a corner having a round shape, if viewed in a plan view, and is positioned at a center portion of the insulating substrate 11. In the example illustrated in FIGS. 1A to 3B, the insulating substrate 11 is formed of four insulating layers 11a, and the recess portion 14 is positioned in first and second insulating layers 11a on one main surface side. Between the bottom surface of the recess portion 14 and the other main surface of the insulating substrate 11, two insulating layers 11a are formed. The example illustrated in FIG. 2A is a top view of an inside of the bottom surface on the recess portion 14, that is, a third insulating layer 11a on the one main surface side, if viewed in a plan view. The example illustrated in FIG. 2B is a top view of an inside between the bottom surface of the recess portion 14 and the other main surface of the insulating substrate 11, that is, of a fourth insulating layer 11a on the one main surface side, if viewed in a plan view.

The recess portion 14 can be formed, for example, by forming a through-hole to be the recess portion 14 in each ceramic green sheet by a laser process, a punching with a mold in a portion of the ceramic green sheets for the insulating substrate 11, and laminating the ceramic green sheets on other ceramic green sheets in which no through-hole is formed.

The via conductors 12, the via pad conductors 13, and the conductor layers 15 are positioned on the surface and the inside of the insulating substrate 11. The via conductors 12, the via pad conductors 13, and the conductor layers 15 are for electrically connecting the electronic component 2 and the module substrate 4. As in the example illustrated in FIGS. 1A to 3B, the conductor layers 15 are positioned on the bottom surface of the recess portion 14 and the other main surface of the insulating substrate 11. The via conductor 12 is positioned in the insulating substrate 11 in the thickness direction (z direction in FIGS. 1A to 3B), and an end portion of the via conductor 12 is connected to the conductor layer 15. The via pad conductor 13 is positioned in the insulating substrate 11, and is positioned between the via conductor 12 on a bottom surface side of the recess portion 14 and the via conductor 12 on the other main surface side of the insulating substrate 11. The upper surface and the lower surface of the via pad conductor 13 are respectively connected to the via conductors 12.

As in the example illustrated in FIGS. 1A to 3B, the via conductor 12 is positioned so as to overlap the recess portion 14, if viewed in a plan view. As in the example illustrated in FIGS. 3A to 4, the via conductors 12 are positioned in at least two insulating layers 11a respectively in the thickness direction of the insulating substrate 11 between the bottom surface of the recess portion 14 and the other main surface of the insulating substrate 11. The via conductor 12 on the bottom surface side of the recess portion 14 and the via conductor 12 on the other main surface side of the insulating substrate 11 overlap each other, if viewed in a plan view, that is, are positioned vertically in the thickness direction from the bottom surface of the recess portion 14 to the other main surface of the insulating substrate 11, if viewed in a longitudinal sectional view.

As in the example illustrated in FIGS. 3A to 4, the via pad conductor 13 gradually increases in thickness from the outer edge portion toward the center portion and has the protruding portion 13a extending from the via conductor 12 in the width direction of the via conductor 12. As illustrated in the example in FIGS. 1A to 3B, the protruding portion 13a of the via pad conductor 13 extends from each of the via conductor 12 connected to the upper surface of the via pad conductor 13 and the via conductor 12 connected to the lower surface thereof in the width direction of the via conductor 12. The width direction of the via conductor 12 is any direction of a width (diameter) of the via conductor 12 in a planar direction, if viewed in a plan view. The protruding portion 13a extending from the via conductor 12 in the width direction of the via conductor 12 means that the protruding portion 13a of the via pad conductor 13 extends to an outside beyond the side surface of the via conductor 12, if viewed in a plan view. In the example illustrated in FIGS. 1A to 3B, the via pad conductor 13 has the protruding portion 13a extending from the via conductor 12 over an entire periphery of the side surface of the via conductor 12.

The via conductor 12, the via pad conductor 13, and the conductor layer 15 are, for example, formed by metallization of metal powder mainly composed of tungsten (W), molybdenum (Mo), manganese (Mn), silver (Ag), copper (Cu), or the like. For example, if the insulating substrate 11 is made of the aluminum oxide sintered body, a metallized paste obtained by adding and mixing an appropriate organic binder and a solvent or the like to a high-melting-point metal powder such as W, Mo, or Mn is preliminarily printed and applied to the ceramic green sheet for the insulating substrate 11 in a predetermined pattern by a screen printing method, and is fired at the same time as the ceramic green sheet for the insulating substrate 11 to be deposited and formed at a predetermined position of the insulating substrate 11. The via pad conductor 13 and the conductor layer 15 are formed by, for example, printing and applying a metallized paste for the via pad conductor 13 and the conductor layer 15 on the ceramic green sheet for the insulating substrate 11 by printing means such as a screen printing method, and firing the metallized paste together with the ceramic green sheet for the insulating substrate 11. The via conductor 12 is formed, for example, by forming a through-hole for the via conductor 12 in the ceramic green sheet for the insulating substrate 11 by a processing method such as a punching with a mold, or a laser process, filling the through-hole with the metallized paste for the via conductor 12 by the printing means, and firing the metallized paste together with the ceramic green sheet for the insulating substrate 11. The metallized paste is produced by appropriately adjusting the viscosity by adding an appropriate solvent and binder to the metal powder described above and kneading. In order to increase a bonding strength with the insulating substrate 11, glass powder or ceramic powder may be included.

As in the example illustrated in FIGS. 3A to 4, the via pad conductor 13 gradually increases in thickness from the outer edge portion toward the inside portion. The via pad conductor 13 can be formed, for example, by making the thickness of the inside greater than the thickness of the outer edge portion side, if the metallized paste for the via pad conductor 13 is printed on the surface of the ceramic green sheet, on the metallized paste for the via conductor 12, with which the through-hole for the via conductor 12 formed in the ceramic green sheet for the insulating substrate 11 is filled.

A metal plating layer is deposited on the surface of the conductor layer 15 exposed from the insulating substrate 11 by an electroplating method or an electroless plating method. The metal plating layer is made of metal having good corrosion resistance and good connection member connectivity, such as nickel, copper, gold, or silver. For example, a nickel plating layer having a thickness of approximately 0.5 to 5 μm and a gold plating layer having a thickness of approximately 0.1 to 3 μm are deposited sequentially. Therefore, the corrosion of the conductor layer 15 can be effectively suppressed, bonding between the conductor layer 15 and the connection member 3 such as a bonding wire, and bonding between the conductor layer 15 and a connection pad 41 for connection positioned on the module substrate 4 can be strengthened.

The metal plating layer is not limited to the nickel plating layer/gold plating layer, and may be other metal plating layers including a nickel plating layer/palladium plating layer/gold plating layer, and the like.

The electronic device can be produced by mounting the electronic component 2 on the bottom surface of the recess portion 14 of the electronic component mounting substrate 1. The electronic component 2 for mounting on the electronic component mounting substrate 1 is a semiconductor element such as an IC chip or an LSI chip, a light emitting element, a piezoelectric element such as a crystal oscillator or a piezoelectric vibrator, or various sensors. For example, if the electronic component 2 is a wire-bonding-type semiconductor element, the semiconductor element is fixed to the bottom surface of the recess portion 14 with a bonding member such as a low-melting-point brazing material or a conductive resin, and then the electrode of the semiconductor element and the conductor layer 15 are electrically connected via the connection member 3 such as a bonding wire, and thereby the semiconductor element is mounted on the electronic component mounting substrate 1. Thus, the electronic component 2 is electrically connected to the conductor layer 15. For example, if the electronic component 2 is a flip-chip-type semiconductor element, the electrode of the semiconductor element and the conductor layer 15 are electrically and mechanically connected to each other via the connection member 3 such as a solder bump, a gold bump, or a conductive resin (anisotropic conductive resin or the like), and thereby the semiconductor element is mounted on the electronic component mounting substrate 1. A plurality of electronic components 2 may be mounted on the bottom surface of the recess portion 14 of the electronic component mounting substrate 1, or a small electronic component such as a resistor element or a capacitor element may be mounted, as necessary. The electronic component 2 is sealed by using a sealing material made of resin, glass, or the like, or a lid made of resin, glass, ceramics, metal, or the like, as necessary.

For example, as illustrated in FIG. 5, the conductor layer 15 of the electronic device of the present embodiment is connected to the connection pad 41 of the module substrate 4 via the solder 5 to form the electronic module. In the electronic device, for example, as illustrated in FIG. 5, the conductor layer 15 positioned on the other main surface of the electronic component mounting substrate 1 is connected to the connection pad 41 of the module substrate 4.

The electronic component mounting substrate 1 of the present embodiment includes the insulating substrate 11 for mounting the electronic component 2, the via conductor 12 positioned in the insulating substrate 11 in the thickness direction, and the via pad conductor 13 positioned in the insulating substrate 11, connected to the via conductor 12, having a thickness that gradually increases from the outer edge portion toward the inside portion, and including the protruding portion 13a protruding from the via conductor 12 in the width direction of the via conductor 12. With the configuration described above, for example, even if the stress is applied to the electronic device including the electronic component mounting substrate 1 in a planar direction and the stress is applied to the via conductor 12 by an external force during handling, the stress is dispersed by the via pad conductor 13 of which the thickness gradually increases from the outer edge portion toward the inside portion, generation of a gap between the insulating substrate 11 and the via conductor 12 is suppressed, and reduction of airtightness between the recess portion 14 and the lower surface of the insulating substrate 11 can be suppressed.

As in the example illustrated in FIG. 4, if the end portion of the protruding portion 13a is pointed, for example, even if the stress is applied to the electronic device including the electronic component mounting substrate 1 in the planar direction, and the stress is applied to the via conductor 12 by an external force during handling, the stress is further dispersed by the via pad conductor 13 having a larger inclined surface from the outer edge portion toward the inside portion, and generation of the gap between the insulating substrate 11 and the via conductor 12 is further suppressed, and reduction of the airtightness between the recess portion 14 and the lower surface of the insulating substrate 11 can be suppressed. Sharpness indicates that the thickness of the via pad conductor 13 is reduced, if viewed in a longitudinal sectional view.

If the protruding portion 13a of the via pad conductor 13 protrudes from the via conductors 12 over an entire periphery of the side surface of the via conductors 12 in the width direction, which are connected to the upper surface and the lower surface, the stress is dispersed by the via pad conductor 13 over the entire periphery of the side surface of the via conductors 12 in the width direction, generation of the gap between the insulating substrate 11 and the via conductors 12 is suppressed, and reduction of the airtightness between the recess portion 14 and the lower surface of the insulating substrate 11 can be suppressed.

As in the example illustrated in FIGS. 3A to 4, if the thickness of the center portion of the via pad conductor 13 is larger than the thickness of the outer edge portion thereof, if viewed in a longitudinal sectional view, for example, even if the stress in the planar direction is applied to the electronic device including the electronic component mounting substrate 1 and the stress is applied to the via conductor 12 by the external force during handling, the stress is dispersed by the via pad conductor 13 of which the thickness of the center portion is larger than the thickness of the outer edge portion. Further, in the insulating substrate 11, the stress is effectively dispersed at a portion that is in contact from the center portion to the outer edge portion of the via pad conductor 13, generation of the gap between the insulating substrate 11 and the via conductor 12 is suppressed, and reduction of the airtightness between the recess portion 14 and the lower surface of the insulating substrate 11 can be suppressed.

As illustrated in FIG. 4, thicknesses H11 and H12 of the respective insulating layers 11a where the via conductors 12 are positioned across the via pad conductor 13 may be within ±10% of one insulating layer 11a (0.9H12≤H11≤1.1H12). In this case, the stress applied to each via conductor 12 is easily dispersed evenly between the bottom surface side of the recess portion 14 and the lower surface side of the insulating substrate 11. Therefore, generation of the gap between the insulating substrate 11 and the via conductor 12 on the bottom surface side of the recess portion 14, and between the insulating substrate 11 and the via conductor 12 on the lower surface side of the insulating substrate 11 is further suppressed, and reduction of the airtightness between the recess portion 14 and the lower surface of the insulating substrate 11 can be suppressed.

If (0.9H12≤H11≤1.1H12) described above is satisfied, if a maximum thickness H2 of the via pad conductor 13 is equal to or greater than a difference between the thicknesses H11 and H12 (H2≥|H11−H12|) of the respective insulating layers 11a where the via conductors 12 are positioned across the via pad conductor 13, the thickness gradually increases and well positioned from the outer edge portion to the inside portion on the bottom surface side of the recess portion 14 and the lower surface side of the insulating substrate 11, and the stress applied to respective via conductors 12 is easily and evenly dispersed on the bottom surface side of the recess portion 14 and the lower surface side of the insulating substrate 11. Therefore, generation of the gap between the insulating substrate 11 and the via conductor 12 on the bottom surface side of the recess portion 14, and between the insulating substrate 11 and the via conductor 12 on the lower surface side of the insulating substrate 11 is further suppressed, and reduction of the airtightness between the recess portion 14 and the lower surface of the insulating substrate 11 can be suppressed.

If one end portion of the via conductor 12 in the width direction and the protruding portion 13a are in contact with each other, if for example, the stress is applied to the electronic device including the electronic component mounting substrate 1 in the planar direction and the stress is applied to the via conductor 12 by the external force during handling and a gap may easily be generated between the insulating substrate 11 and the via conductor 12, the airtightness is easily maintained at a portion where the one end portion of the via conductor 12 in the width direction is in contact with the protruding portion 13a, the protruding portion 13a, and a portion where the protruding portion 13a is in contact with the insulating substrate 11. Thus, reduction of the airtightness between the recess portion 14 and the lower surface of the insulating substrate 11 can be suppressed.

If both end portions of the via conductor 12 in the width direction are in contact with the protruding portion 13a, if for example, the stress is applied to the electronic device including the electronic component mounting substrate 1 in the planar direction and the stress is applied to the via conductor 12 by the external force during handling and a gap may easily be generated between the insulating substrate 11 and the both end portions of the via conductor 12 in the width direction, the airtightness is further easily maintained at a portion where the both end portions of the via conductor 12 in the width direction are in contact with the protruding portion 13a, the protruding portion 13a, and a portion where the protruding portion 13a is in contact with the insulating substrate 11. Thus, reduction of the airtightness between the recess portion 14 and the lower surface of the insulating substrate 11 can be suppressed. The outer edge of the entire periphery of the via conductor 12 in the width direction may be connected to the protruding portion 13a.

Figure 6:
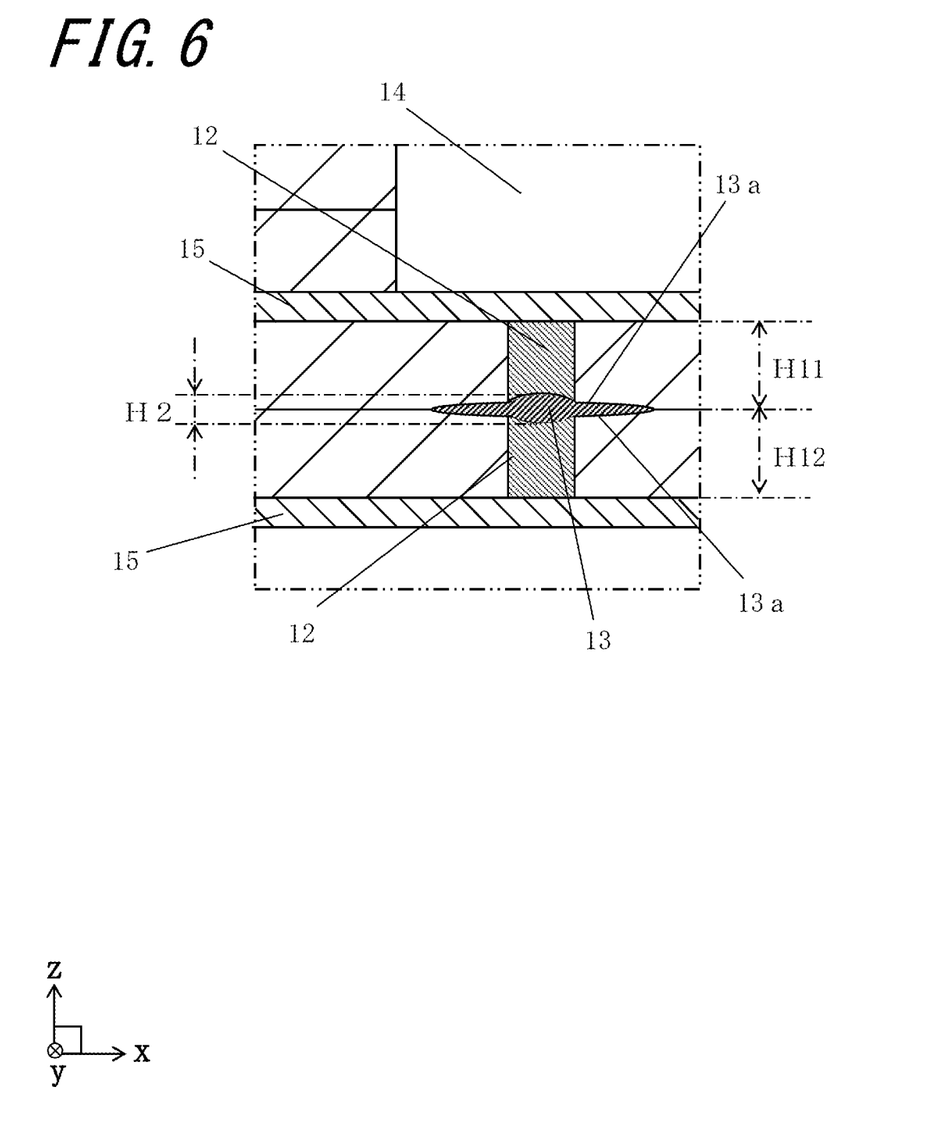
FIG. 6 is an enlarged sectional view of a main portion in another example of the electronic device in the first embodiment.

As in the example illustrated in FIG. 6, if an inclination of a contact surface between the via conductor 12 and the via pad conductor 13 is larger than an inclination of a contact surface between the insulating layer 11a and the via pad conductor 13, for example, even if the stress is applied to the electronic device including the electronic component mounting substrate in the planar direction and the stress is applied to the via conductor by the external force during handling, the stress is effectively dispersed by the via pad conductor in which the inclination of the contact surface between the via conductor 12 and the via pad conductor 13 is large. Thus, generation of the gap between the insulating substrate and the via conductor is effectively suppressed, and reduction of the airtightness between the recess portion 14 and the lower surface of the insulating substrate 11 can be suppressed. The inclination of the contact surface between the via conductor 12 and the via pad conductor 13 may be larger than the inclination of the contact surface between the insulating layer 11a and the via pad conductor 13, and the protruding portion 13a may be connected, at the outer edge of the entire periphery of the via conductor 12 in the width direction.

For example, such via conductors 12 and via pad conductors 13 can be formed as follows. If the through-hole for the via conductor 12 in the ceramic green sheet for the insulating substrate 11 is filled with the metallized paste for the via conductor 12, an opening of the through-hole for the via conductor 12 is filled with the metallized paste for the via conductor 12 so that a sectional view has a recessed-curved surface shape (shape that is recessed from the outer edge portion of the opening toward the center portion of the opening), and the through-hole for the via conductor 12 is filled with the metallized paste for the via pad conductor 13 on the metallized paste for the via conductor 12, whereby the via conductors 12 and the via pad conductors 13 are formed on the surface of the ceramic green sheet by printing.

If the via conductor 12 and the via pad conductor 13 contain the same ceramic as the insulating substrate 11, the content ratio of ceramic contained in the via pad conductor 13 may be higher than the content ratio of ceramic contained in the via conductor 12. For example, the content ratio of ceramic contained in the via pad conductor 13 may be as high as approximately 1.2 to 2 times the content ratio of ceramic contained in the via conductor 12. Therefore, a resistance difference between the via pad conductor 13 and the via conductor 12 having a smaller area, if viewed in a plan view, than that of the via pad conductor 13 is reduced, the contact between the via conductor 12 and the via pad conductor 13 is good, and a shift between the via conductor 12 and the via pad conductor 13 is suppressed. Therefore, reduction of the airtightness between the recess portion 14 and the lower surface of the insulating substrate 11 can be suppressed.

The electronic device according to the present embodiment includes the electronic component mounting substrate 1 having the configuration described above, and the electronic component 2 mounted on the electronic component mounting substrate 1, and thereby an electronic device having good long-term reliability can be obtained.

The electronic module of the present embodiment includes the module substrate 4 having the connection pad 41 and the electronic device having the configuration described above connected to the connection pad 41 via the solder 5, and thereby having good long-term reliability.

The electronic component mounting substrate 1 in the present embodiment can be suitably used in a thin and high-power electronic device. In particular, the electronic component mounting substrate 1 can be suitably used if the diameter of the via conductor 12 is smaller than a height of the via conductor 12. For example, if a light emitting element such as an LED is mounted as the electronic component 2 on the bottom surface of the recess portion 14, the airtightness of the recess portion 14 is good and the electronic component mounting substrate 1 can be suitably used as the electronic component mounting substrate 1 for a thin and high-luminance light emitting device.

Second Embodiment

Next, an electronic device according to a second embodiment will be described with reference to FIGS. 7A to 10.

The electronic device according to the second embodiment is different from the electronic device according to the embodiment described above in that a plurality of via conductors 12 is connected to an upper surface and a lower surface of one via pad conductor 13, respectively. In the example illustrated in FIGS. 7A to 10, two via conductors 12 are connected to the upper surface of one via pad conductor 13, and two via conductors 12 are connected to the lower surface of one via pad conductor 13.

Figure 7A:
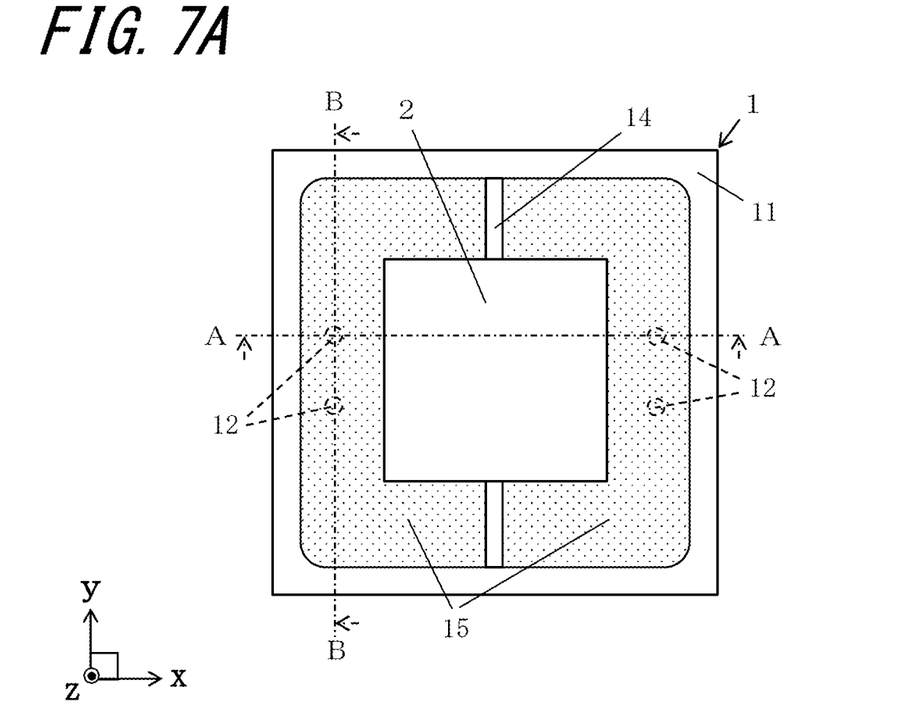
FIG. 7A is a top view illustrating an electronic device in a second embodiment and FIG. 7B is a bottom view of FIG. 7A.
Figure 7B:
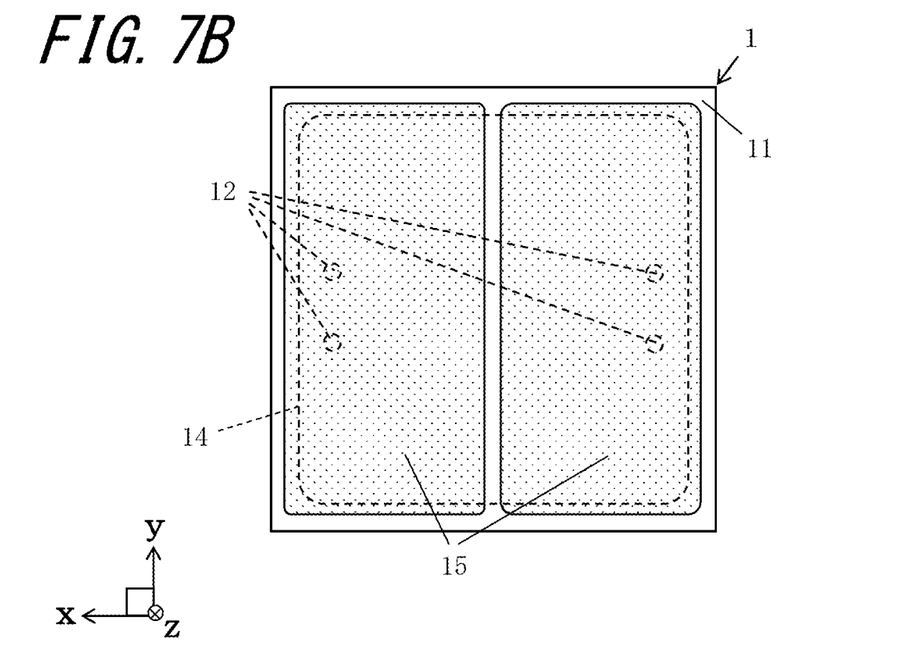
Figure 8A:
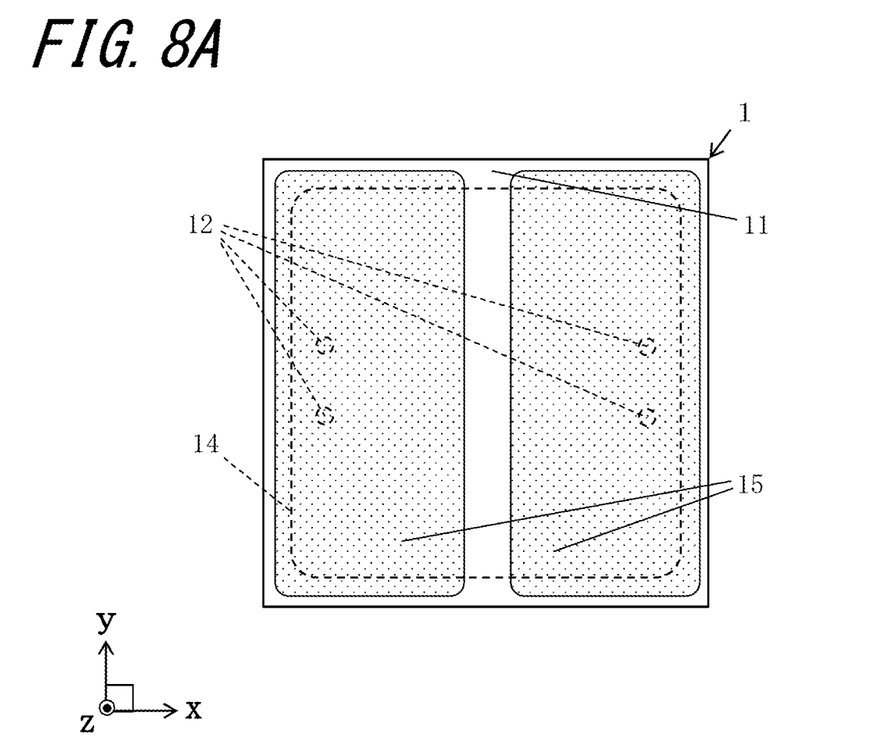
FIGS. 8A and 8B are top views of an inside of the electronic device illustrated in FIGS. 7A and 7B.
Figure 8B:
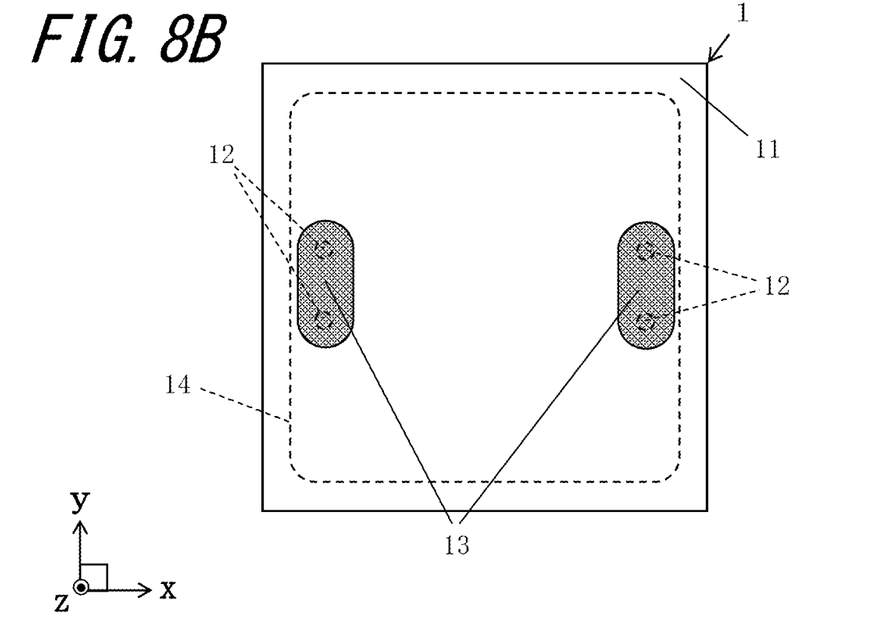
Figure 9A:
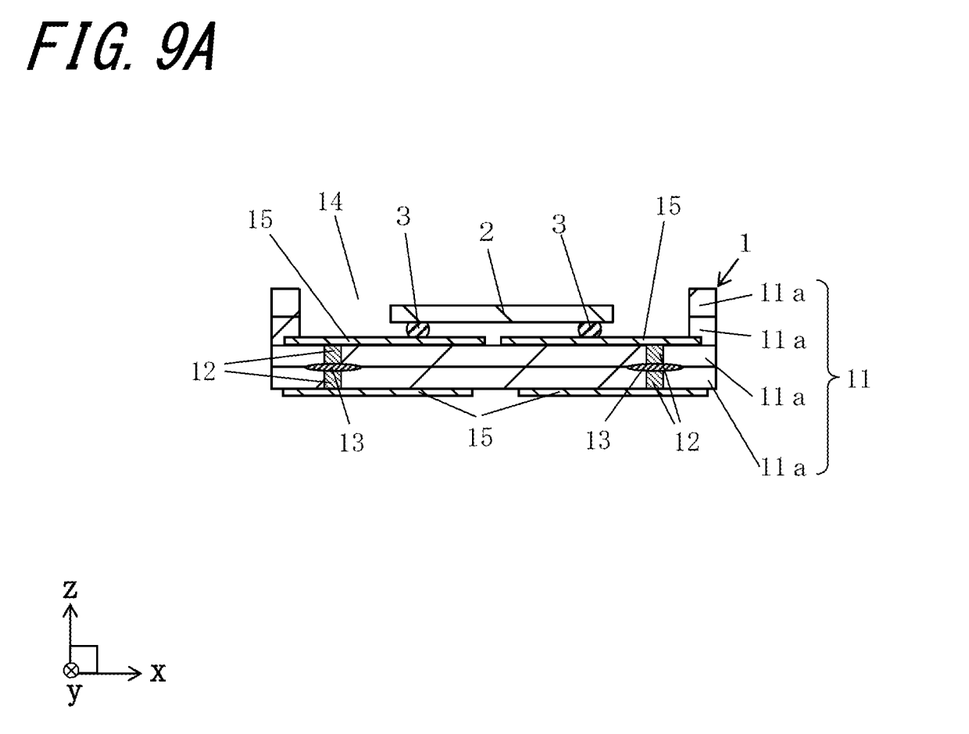
FIG. 9A is a longitudinal sectional view taken along line A-A of the electronic device illustrated in FIG. 7A
Figure 9B:
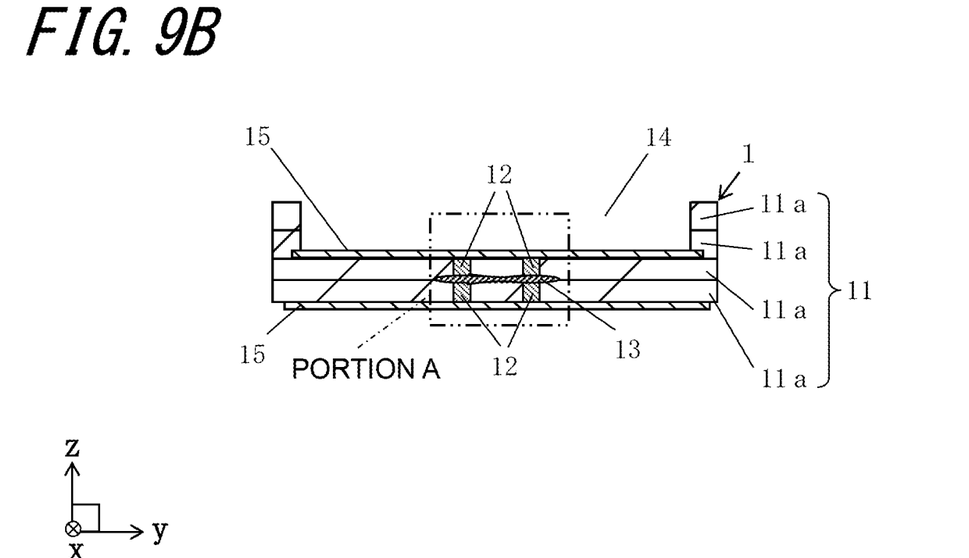
FIG. 9B is a longitudinal sectional view taken along line B-B.

In the example illustrated in FIGS. 7A and 7B, the conductor layers 15 are indicated by shading, if viewed in a plan view, and a portion overlapping a side surface of the via conductor 12 is indicated by a dotted line. In the example illustrated in FIGS. 8A and 8B, the via pad conductors 13 and the conductor layers 15 are indicated by shading, and a portion overlapping the side surface of the via conductor 12 and a portion overlapping an inner wall of the recess portion 14 are indicated by dotted lines.

According to the electronic component mounting substrate 1 of the second embodiment, similarly to the electronic component mounting substrate 1 of the first embodiment, for example, even if the stress in the planar direction is applied to an electronic device including the electronic component mounting substrate 1 and the stress is applied to the individual via conductors 12 by an external force during handling, the stress is dispersed by the via pad conductor of which the thickness gradually increases from the outer edge portion toward the inside portion, generation of a gap between the insulating substrate 11 and the individual via conductors 12 is suppressed, and reduction of the airtightness between the recess portion 14 and the lower surface of the insulating substrate 11 can be suppressed.

Figure 10:
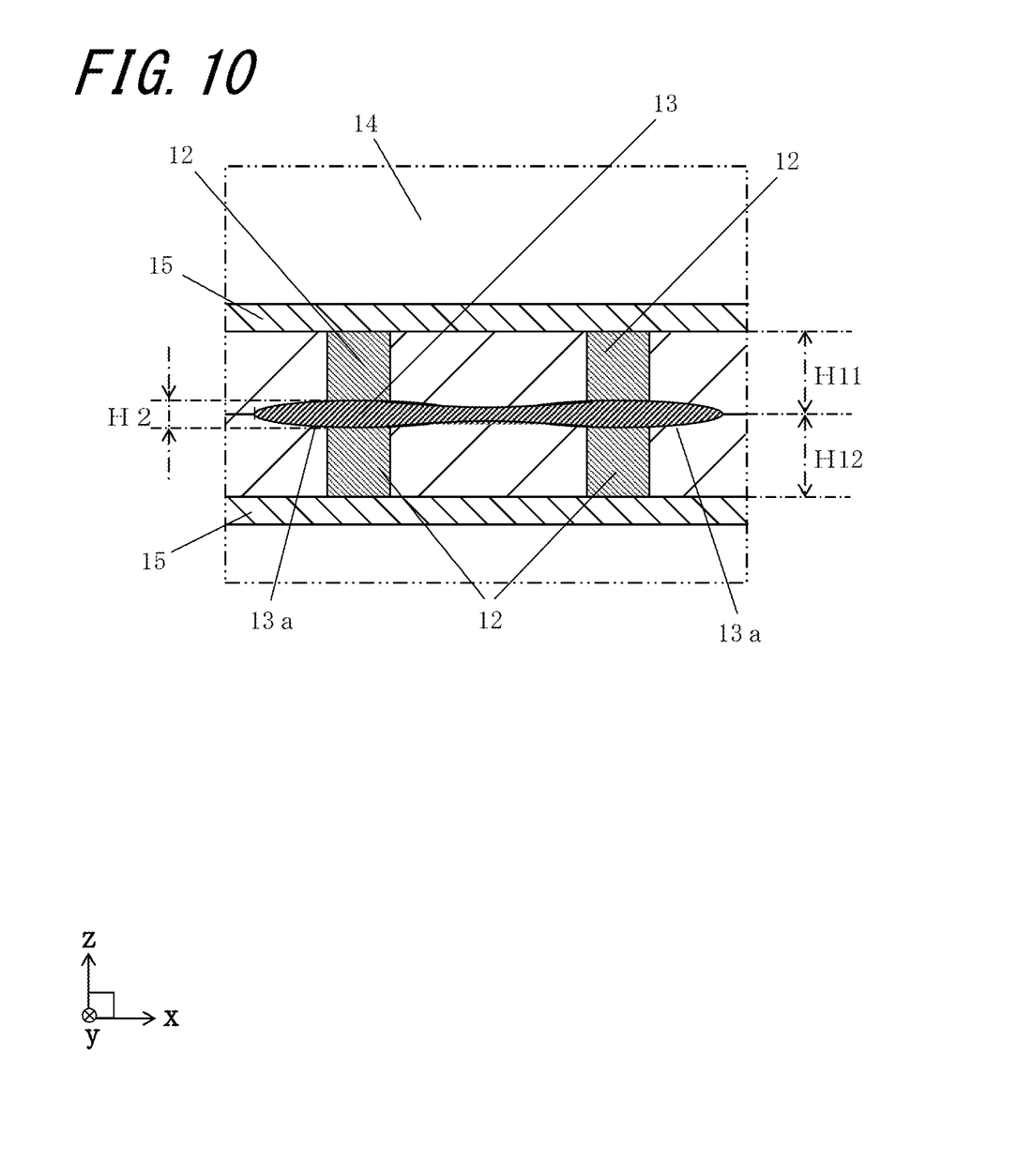
FIG. 10 is an enlarged sectional view of a main portion in portion A of the electronic device illustrated in FIG. 9B.

In the example illustrated in FIG. 10, in the electronic component mounting substrate 1 according to the second embodiment, a thickness of the via pad conductor 13 between the plurality of via conductors 12, if viewed in a longitudinal sectional view is smaller than a thickness of the via pad conductor 13 in a region overlapping the via conductors 12, if viewed in a plan view. In the electronic component mounting substrate 1 according to the second embodiment, the via pad conductor 13 connected to the plurality of via conductors 12 includes protruding portion 13a protruding from the plurality of via conductors 12 in the width direction of the via conductor 12. As in the examples illustrated in FIGS. 7A to 10, the protruding portion 13a of the via pad conductor 13 extends from each of the plurality of via conductors 12 connected to the upper surface of the via pad conductor 13 and the plurality of via conductors 12 connected to the lower surface thereof in the width direction of the via conductor 12.

If the protruding portion 13a of the via pad conductor 13 protrudes from each via conductor 12 over an entire periphery of the side surface in the width direction of the plurality of the via conductors 12 connected to the upper surface and the lower surface, the stress is dispersed by the via pad conductor 13 over the entire periphery of the side surface of the via conductors 12 in the width direction, generation of the gap between the insulating substrate 11 and the via conductor 12 is suppressed, and reduction of the airtightness between the recess portion 14 and the lower surface of the insulating substrate 11 can be suppressed.

Figure 11A:
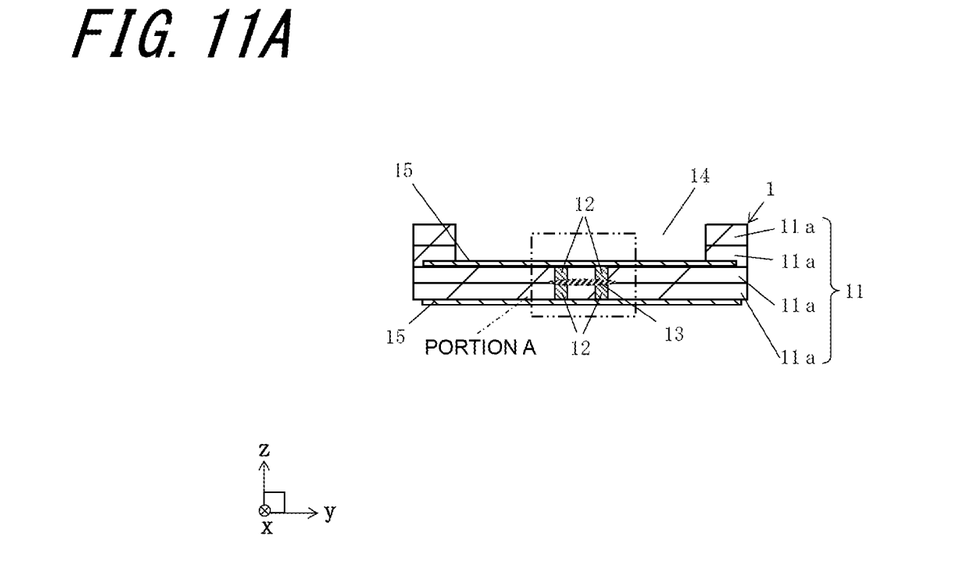
FIG. 11A is a sectional view in another example of the electronic device in the second embodiment and FIG. 11B is an enlarged sectional view of a main portion in portion A of FIG. 11A.
Figure 11B:
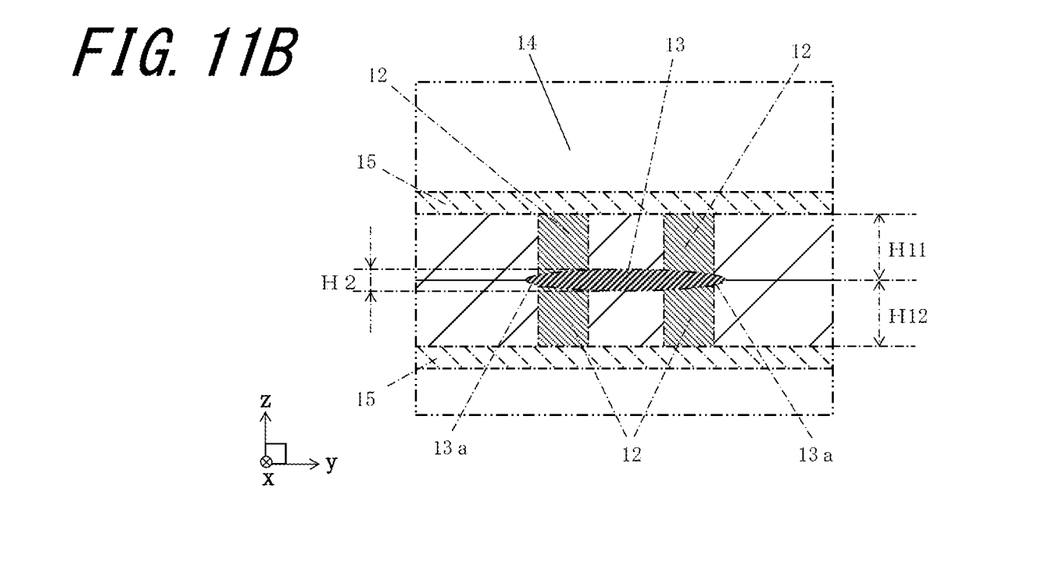

As in the example illustrated in FIGS. 11A and 11B, the thickness of the via pad conductor 13 between the plurality of via conductors 12 if viewed in a plan view may be larger than the thickness of the via pad conductor 13 in a region overlapping the via conductors 12, if viewed in a sectional view.

The electronic component mounting substrate 1 of the second embodiment can be produced by using the same producing method as that of the electronic component mounting substrate 1 of the embodiment described above.

Similarly to the electronic component mounting substrate 1 of the first embodiment, the electronic component mounting substrate 1 of the second embodiment can be suitably used in a thin and high-power electronic device. In particular, the electronic component mounting substrate 1 can be suitably used if the diameter of the via conductor 12 is smaller than a height of the via conductor 12. For example, if a light emitting element such as an LED is mounted as the electronic component 2 on the bottom surface of the recess portion 14, the airtightness of the recess portion 14 is good and the electronic component mounting substrate 1 can be suitably used as the electronic component mounting substrate 1 for a thin and high-luminance light emitting device.

Third Embodiment

Next, an electronic device according to a third embodiment will be described with reference to FIG. 12.

The electronic device according to the third embodiment is different from the electronic device according to the embodiments described above in that the number of via conductors 12 connected to the upper surface of one via pad conductor 13 is different from the number of via conductors 12 connected to the lower surface of one via pad conductor 13. In the example illustrated in FIG. 12, two via conductors 12 are connected to the upper surface of one via pad conductor 13, and one via conductor 12 is connected to the lower surface of the one via pad conductor 13.

According to the electronic component mounting substrate 1 of the third embodiment, similarly to the electronic component mounting substrate 1 of the first embodiment, for example, even if the stress in the planar direction is applied to an electronic device including the electronic component mounting substrate 1 and the stress is applied to the via conductor 12 by an external force during handling, the stress is dispersed by the via pad conductor 13 of which the thickness gradually increases from the outer edge portion toward the inside portion, generation of a gap between the insulating substrate 11 and the via conductors 12 is suppressed. In addition, the via conductor 12 on the bottom surface side of the recess portion 14 and the via conductor 12 on the lower surface side of the insulating substrate 11 are positioned not to overlap each other across the via pad conductor 13, if viewed in a plan view, so that the stress applied to the via pad conductor 13 is dispersed in the planar direction, and reduction of the airtightness between the recess portion 14 and the lower surface of the insulating substrate 11 can be effectively suppressed.

Figure 12:
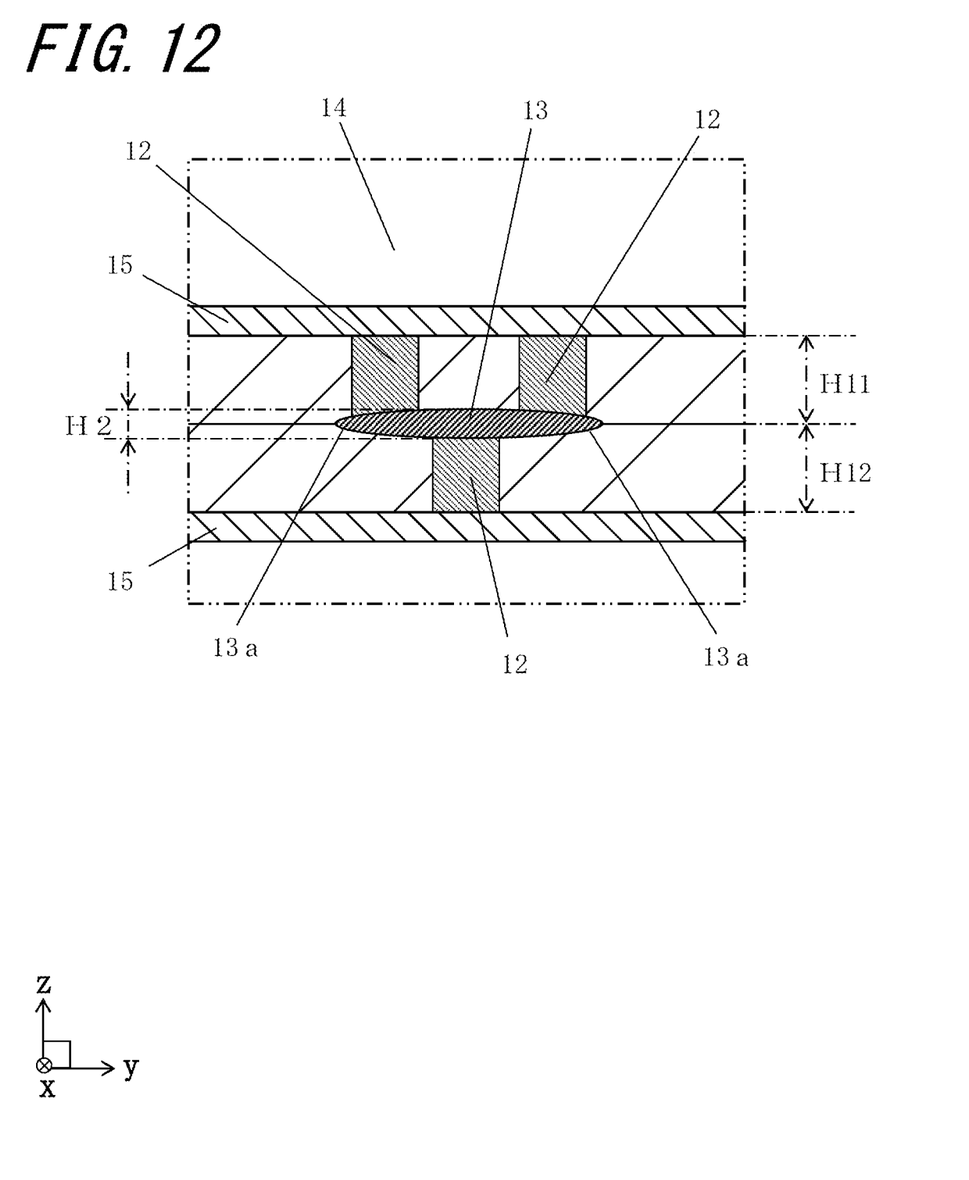
FIG. 12 is an enlarged sectional view of a main portion in an electronic device in a third embodiment.

As in the example illustrated in FIG. 12, each via conductor 12 connected to the lower surface of one via pad conductor 13 is positioned between the via conductors 12 connected to the upper surface of one via pad conductor 13, if viewed in a longitudinal sectional view. The via conductors 12 connected to the upper surface of one via pad conductor 13 and each via conductor 12 connected to the lower surface of one via pad conductor 13 are positioned so as not to overlap each other, if viewed in a plan view.

In the electronic component mounting substrate 1 according to the third embodiment, the via pad conductor 13 connected to the plurality of via conductors 12 includes the protruding portions 13a protruding from the plurality of via conductors 12 in the width direction of the via conductors 12. As in the example illustrated in FIG. 12, the protruding portion 13a of the via pad conductor 13 extends from each of the plurality of via conductors 12 connected to the upper surface of the via pad conductor 13 and the via conductor 12 connected to the lower surface thereof in the width direction of the via conductor 12.

If the protruding portion 13a of the via pad conductor 13 protrudes from each via conductor 12 over an entire periphery of the side surface in the width direction of the plurality of the via conductors 12 connected to the upper surface and the lower surface, the stress is dispersed by the via pad conductor 13 over the entire periphery of the side surface of the via conductors 12 in the width direction, generation of the gap between the insulating substrate 11 and the via conductor 12 is suppressed, and reduction of the airtightness between the recess portion 14 and the lower surface of the insulating substrate 11 can be suppressed.

The electronic component mounting substrate 1 of the third embodiment can be produced by using the same producing method as that of the electronic component mounting substrate 1 of the embodiments described above.

Similarly to the electronic component mounting substrate 1 of the first embodiment, the electronic component mounting substrate 1 of the third embodiment can be suitably used in a thin and high-power electronic device. In particular, the electronic component mounting substrate 1 can be suitably used if the diameter of the via conductor 12 is smaller than a height of the via conductor 12. For example, if a light emitting element such as an LED is mounted as the electronic component 2 on the bottom surface of the recess portion 14, the airtightness of the recess portion 14 is good and the electronic component mounting substrate 1 can be suitably used as the electronic component mounting substrate 1 for a thin and high-luminance light emitting device.

The present disclosure is not limited to the examples of the embodiments described above, and various modifications are possible. For example, the insulating substrate 11 may have a rectangular shape including a notch portion or a chamfered portion on a side surface or at a corner, if viewed in a plan view. A notch may be positioned from the side surface of the insulating substrate 11 to the other main surface, and a conductor connected to the conductor layer 15 and positioned on an inner surface of the notch, that is, a castellation conductor may be included.

In the electronic component mounting substrates 1 according to the first to third embodiments, the inner wall surface of the recess portion 14 is positioned perpendicular to the bottom surface of the recess portion 14, if viewed in a sectional view. However, the inner wall surface of the recess portion 14 may be an inclined surface so that, in the inner wall surface of the recess portion 14, an opening side is wider than a bottom surface side of the recess portion 14. A metal layer may be positioned on the inner wall surface of the recess portion 14. For example, if a light emitting element is used as the electronic component 2, if a metal layer having good reflectance is positioned on the inner wall surface of the recess portion 14, the electronic component mounting substrate 1 can be suitably used as the electronic component mounting substrate 1 for a light emitting device having good light emission luminance.

In the electronic component mounting substrates 1 of the first to third embodiments, embodiments may be combined. For example, in the electronic component mounting substrate 1 of the second embodiment or the electronic component mounting substrate 1 of the third embodiment, as in the example illustrated in the electronic component mounting substrate 1 of the first embodiment, the inclination of the contact surface between the via conductor 12 and the via pad conductor 13 may be larger than the inclination of the contact surface between the insulating layer 11a and the via pad conductor 13.

In the electronic component mounting substrates 1 of the first to third embodiments, the recess portion 14 has a substantially rectangular shape, if viewed in a plan view, but may have another shape such as a circular shape, if viewed in a plan view.

In the embodiments described above, an example, in which the insulating substrate 11 is configured of four insulating layers 11a, is illustrated. However, the insulating substrate 11 may be configured of two, three, or five or more insulating layers 11a. The recess portion 14 may be a recess portion 14 of which an inner wall surface is stepped, if viewed in a longitudinal sectional view.

The electronic component mounting substrates 1 of the first to third embodiments have the recess portion 14 positioned on one main surface, but may not have a recess portion, that is, the electronic component mounting substrate 1 having a flat insulating substrate 11 may be provided. In this case, if a frame or a lid having a frame portion is bonded to one main surface of the electronic component mounting substrate 1, the airtightness between the one main surface of the insulating substrate 11 and the other main surface of the insulating substrate 11 can be improved.

The electronic component mounting substrate 1 may be produced in a form of a multi-piece substrate.

The invention claimed is:

1. An electronic component mounting substrate comprising:
    an insulating substrate for mounting an electronic component;
    a via conductor disposed in the insulating substrate in a thickness direction of the insulating substrate; and
    a via pad conductor
        disposed in the insulating substrate,
        connected to the via conductor,
        having a thickness gradually increasing from an outer edge portion toward an inside portion, and
        comprising a protruding portion protruding from the via conductor in a width direction of the via conductor.

2. The electronic component mounting substrate according to claim 1, wherein
an end portion of the protruding portion is pointed.

3. The electronic component mounting substrate according to claim 1, wherein
a thickness of a center portion of the via pad conductor is larger than a thickness of an outer edge portion of the via pad conductor.

4. The electronic component mounting substrate according to claim 1, wherein
one end portion of the via conductor in the width direction is in contact with the protruding portion.

5. The electronic component mounting substrate according to claim 1, wherein
both end portions of the via conductor in the width direction are in contact with the protruding portion.

6. An electronic device comprising:
the electronic component mounting substrate according to claim 1; and
an electronic component mounted on the electronic component mounting substrate.

7. An electronic module comprising:
a module substrate comprising a connection pad; and
the electronic device according to claim 6 connected to the connection pad via solder.

8. The electronic component mounting substrate according to claim 2, wherein
a thickness of a center portion of the via pad conductor is larger than a thickness of an outer edge portion of the via pad conductor.

9. The electronic component mounting substrate according to claim 2, wherein
one end portion of the via conductor in the width direction is in contact with the protruding portion.

10. The electronic component mounting substrate according to claim 3, wherein
one end portion of the via conductor in the width direction is in contact with the protruding portion.

11. The electronic component mounting substrate according to claim 8, wherein
one end portion of the via conductor in the width direction is in contact with the protruding portion.

12. The electronic component mounting substrate according to claim 2, wherein
both end portions of the via conductor in the width direction are in contact with the protruding portion.

13. The electronic component mounting substrate according to claim 3, wherein
both end portions of the via conductor in the width direction are in contact with the protruding portion.

14. The electronic component mounting substrate according to claim 8, wherein
both end portions of the via conductor in the width direction are in contact with the protruding portion.

* * * * *